US012740372B2

(12) United States Patent
Chang et al.

(10) Patent No.: US 12,740,372 B2
(45) Date of Patent: Sep. 15, 2026

(54) WAFER HOLDING DEVICE HAVING FUNCTION OF POSITIONING WAFER

(71) Applicant: SKY TECH INC., Hsinchu County (TW)

(72) Inventors: Jung-Hua Chang, Hsinchu County (TW); Ta-Hao Kuo, Hsinchu County (TW); Mao-Chan Chang, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 387 days.

(21) Appl. No.: 18/504,123

(22) Filed: Nov. 7, 2023

(65) Prior Publication Data

US 2025/0149366 A1 May 8, 2025

(51) Int. Cl.
*H10P 72/50* (2026.01)
*H10P 72/78* (2026.01)

(52) U.S. Cl.
CPC .............. *H10P 72/50* (2026.01); *H10P 72/78* (2026.01)

(58) Field of Classification Search
CPC .. H10P 72/7608; H10P 72/7612; H10P 72/78; H10P 72/7614; H10P 72/50
See application file for complete search history.

(56) References Cited

U.S. PATENT DOCUMENTS 4,944,650 A * 7/1990 Matsumoto ............. H10P 72/50 414/757
2005/0111161 A1* 5/2005 Tran .................... H10P 72/7612 361/234
2020/0381319 A1* 12/2020 Tang ....................... H10P 72/78

* cited by examiner

*Primary Examiner* — Tyrone V Hall, Jr.
(74) *Attorney, Agent, or Firm* — HDLS IPR SERVICES; Chun-Ming Shih

(57) ABSTRACT

A wafer holding device configured to fix a and position a wafer having a positioning structure. The wafer holding device includes a base, a holder plate, pushing pins, a linear actuator, and a positioning member. The holder plate is disposed on the base. An upper surface of the holder plate is provided with an adsorption structure for adsorbing and fixing the wafer. The pushing pins are disposed on the upper surface in a protruding manner, and each pushing pin is disposed on the holder plate with respect to a predetermined datum center on the holder plate. The linear actuator is disposed on the base, and an actuating direction of the linear actuator is in parallel to the upper surface. The positioning member is driven by the linear actuator to move in the actuating direction to contact and push against the positioning structure of the wafer.

10 Claims, 17 Drawing Sheets

130
132
132a
132b
134
136
140
C1

WAFER HOLDING DEVICE HAVING FUNCTION OF POSITIONING WAFER

BACKGROUND

Technical Field

This disclosure relates to holding and positioning a wafer, and in particular to wafer holding device having function of positioning the wafer.

Related Art

Existing wafer fabrication processes continuously process the wafer surface in multiple passes, with continuous etching or stacking of wafer patterns. Each process of etching or stacking must fall on the predefined position of the same component in order to complete the component.

Typically, the above process is performed on different wafer chucks. When a wafer is transferred to a wafer chuck, the wafer must be positioned so that the process executed on the wafer chuck will fall in the correct position on the wafer.

Most existing wafer positioning is performed by optical detection or image recognition. Generally, the wafer is provided with a positioning structure or pattern. Taking the positioning structure as an example, a common practice is to set a flat edge or notch on the edge of the wafer, identify the position of the flat edge/notch through optical detection or image recognition, and rotate the wafer with respect to the vertical axis of the wafer through a rotating mechanism so that the flat edge/notch can be positioned in the correct position.

In the above positioning method, the rotating mechanism is required and the accuracy of the positioning depends on the accuracy of the recognition of flat edges/notches by optical detection or image recognition. This makes the mechanism of the wafer chuck device complicated. The high accuracy of recognition and rotation also increases the cost of the equipment and the time required for positioning.

SUMMARY

In view of the above problem, this disclosure provides a wafer holding device having function of positioning a wafer, configured to quickly positioning the wafer.

This disclosure discloses a wafer holding device configured to fix a wafer thereon and position the wafer having a positioning structure at an edge of the wafer. The wafer holding device includes a base, a holder plate, a plurality of pushing pins, a linear actuator, and a positioning member. The holder plate is disposed on the base. The holder plate includes an upper surface and a lower surface. The upper surface is provided for the wafer to be placed thereon. And the upper surface is provided with an adsorption structure for adsorbing and fixing the wafer. The pushing pins are disposed on the upper surface in a protruding manner, and each of the pushing pins is disposed on the holder plate at intervals around the holder plate with respect to a predetermined datum center on the holder plate. The linear actuator is disposed on the base, and an actuating direction of the linear actuator is in parallel to the upper surface. The positioning member is configured to be driven by the linear actuator to move in the actuating direction to contact and push against the positioning structure of the wafer.

In one or more embodiments, the adsorption structure includes a vacuum adsorption orifice and air-conducting grooves connected to the vacuum adsorption orifice, and the vacuum adsorption orifice communicates the upper surface and the lower surface.

In one or more embodiments, the wafer holding device having function of positioning wafer further comprises an air evacuating pump; wherein the vacuum adsorption orifice is connected to the air evacuating pump at the lower surface.

In one or more embodiments, the wafer holding device having function of positioning wafer further comprises a plurality of lifting pins, disposed in the holder plate in a rising and lowering manner; wherein the lifting pins are able to lower and embedded in the holder plate or rise to protrude on the upper surface.

In one or more embodiments, the linear actuator is connected to the base via a bracket, and the linear actuator includes at least one linear guide, a movable block, and a leadscrew. the movable block is combined with the at least one linear guide in a movable manner, and a moving direction of the movable block is in parallel to the actuating direction of the linear actuator. the leadscrew has one end connected to the bracket in a rotatable manner and the other end passing through a hollow space of the movable block and connected to the movable block in a rotatable manner.

In one or more embodiments, the linear actuator further includes a compression spring sleeved over the leadscrew; wherein one end of the compression spring presses against the movable block and the other end connected to the at least one linear guide.

In one or more embodiments, the linear actuator further includes a compression spring sleeved over the leadscrew; wherein one end of the compression spring presses against the movable block and the other end presses against the bracket.

In one or more embodiments, the positioning member is provided with a position plane at a front end.

In one or more embodiments, the positioning member is flat, perpendicular to the upper surface, and extends toward the predetermined datum center.

In one or more embodiments, the holder plate is provided with a trough and the trough is located on the upper surface and communicates an edge of the holder plate; wherein a part of the positioning member and a part of the linear actuator are movably disposed in the trough.

The wafer holding device achieves wafer positioning through the coordination of the positioning structure, the positioning member, and pushing pins. The positioning process does not involve the detection and identification of wafer position/positioning structure, greatly simplifying the complexity of the positioning mechanism. In addition, this disclosure achieves quick positioning and easily improves the accuracy of positioning without affecting the rate at which the positioning operation is performed.

BRIEF DESCRIPTION OF THE DRAWINGS

This disclosure will become more fully understood from the detailed description given herein below for illustration only, and thus not limitative of this disclosure, wherein.

DETAILED DESCRIPTION

Please refer to FIG. 1, FIG. 2, FIG. 3 and FIG. 4. A wafer holding device 100 having function of positioning a wafer 200 is illustrated. the wafer holding device 100 is configured to fix the wafer 200 thereon, and is able to position the wafer 200. And edge of the wafer 200 is provided with a positioning structure, and the positioning structure can be but not limited to a flat edge 212 or a notch. The flat edge 212 is taken as an illustration in the first embodiment.

Figure 1:
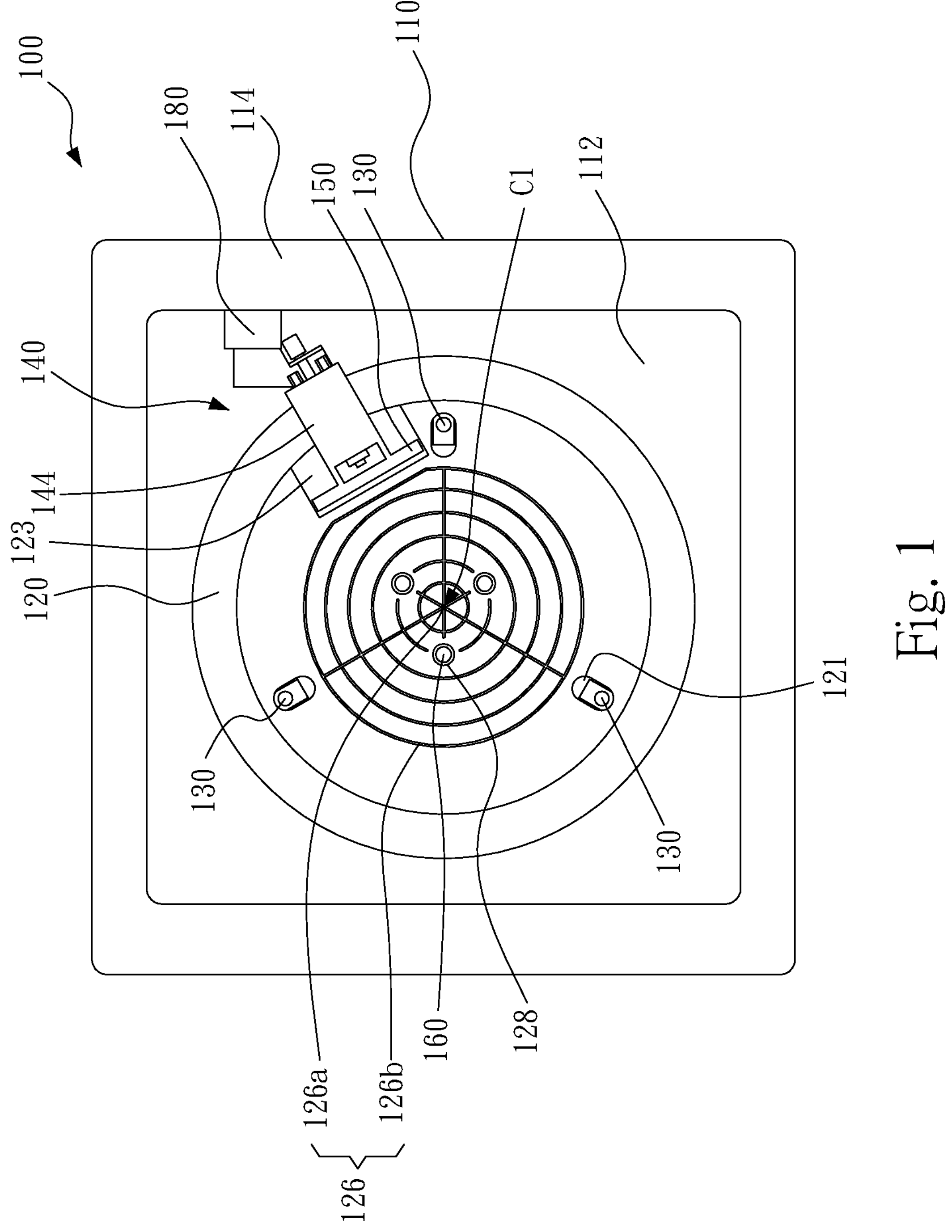
FIG. 1 is a top view of the wafer holding device having function of positioning wafer according to a first embodiment of this disclosure.
Figure 2:
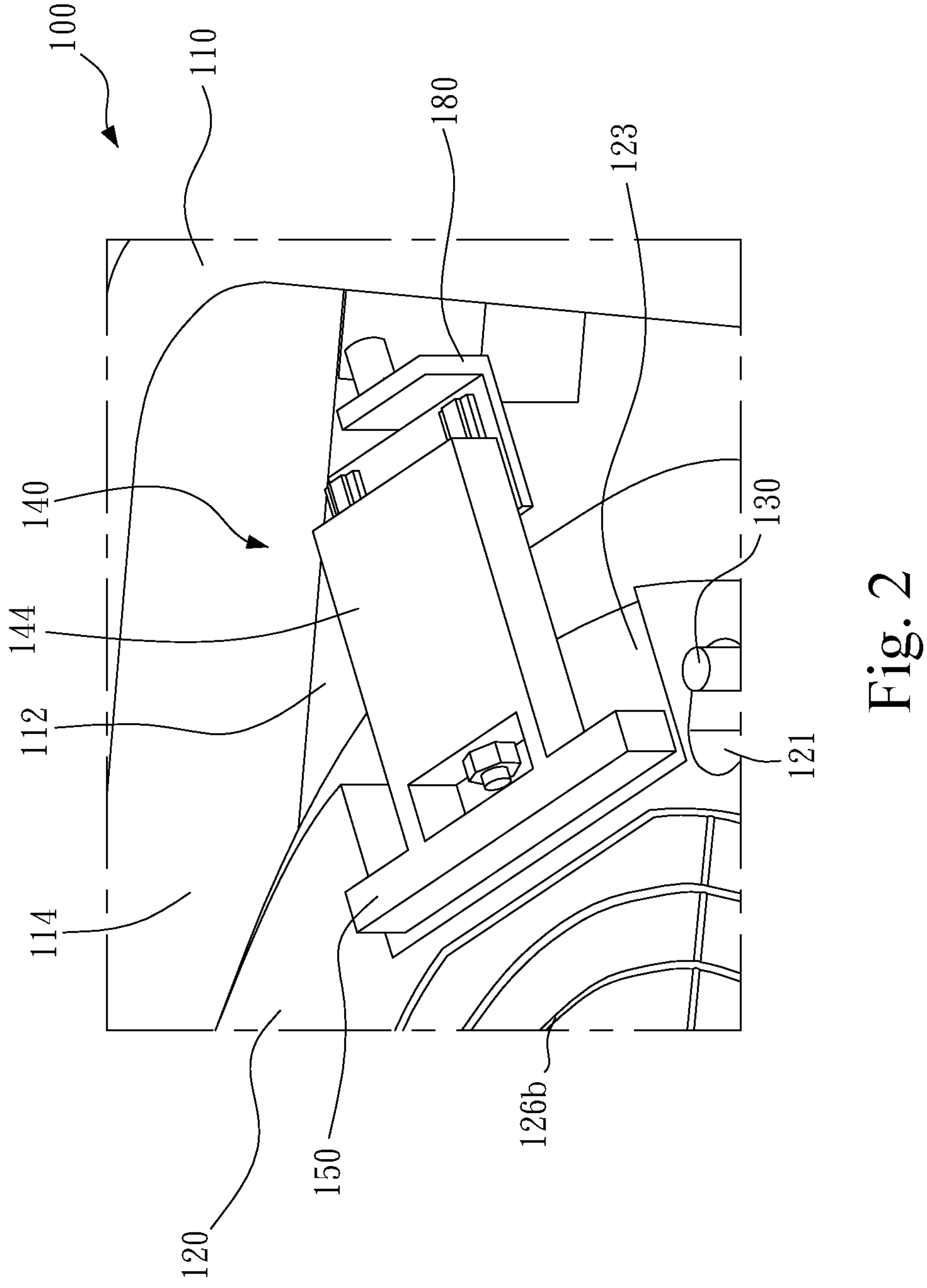
FIG. 2 is a partial perspective view of the wafer holding device wafer according to the first embodiment of this disclosure.

As shown in FIG. 1 and FIG. 2, the wafer holding device 100 includes a base 110, a holder plate 120, a plurality of pushing pins 130, a linear actuator, 140 and a positioning member 150.

As shown in FIG. 1 and FIG. 2, The base 110 is used for setting the holder plate 120 and the linear actuator 140; that is, the holder plate 120 and the linear actuator 140 are directly and indirectly disposed on the base 110. The base 110 may be a flat plate, a vessel, or other configuration; in the first embodiment the vessel is taken as an illustration of the base 110. As shown in the drawings, the base includes a bottom 112 and a lateral wall 114 surrounds the bottom 112.

Figure 5:
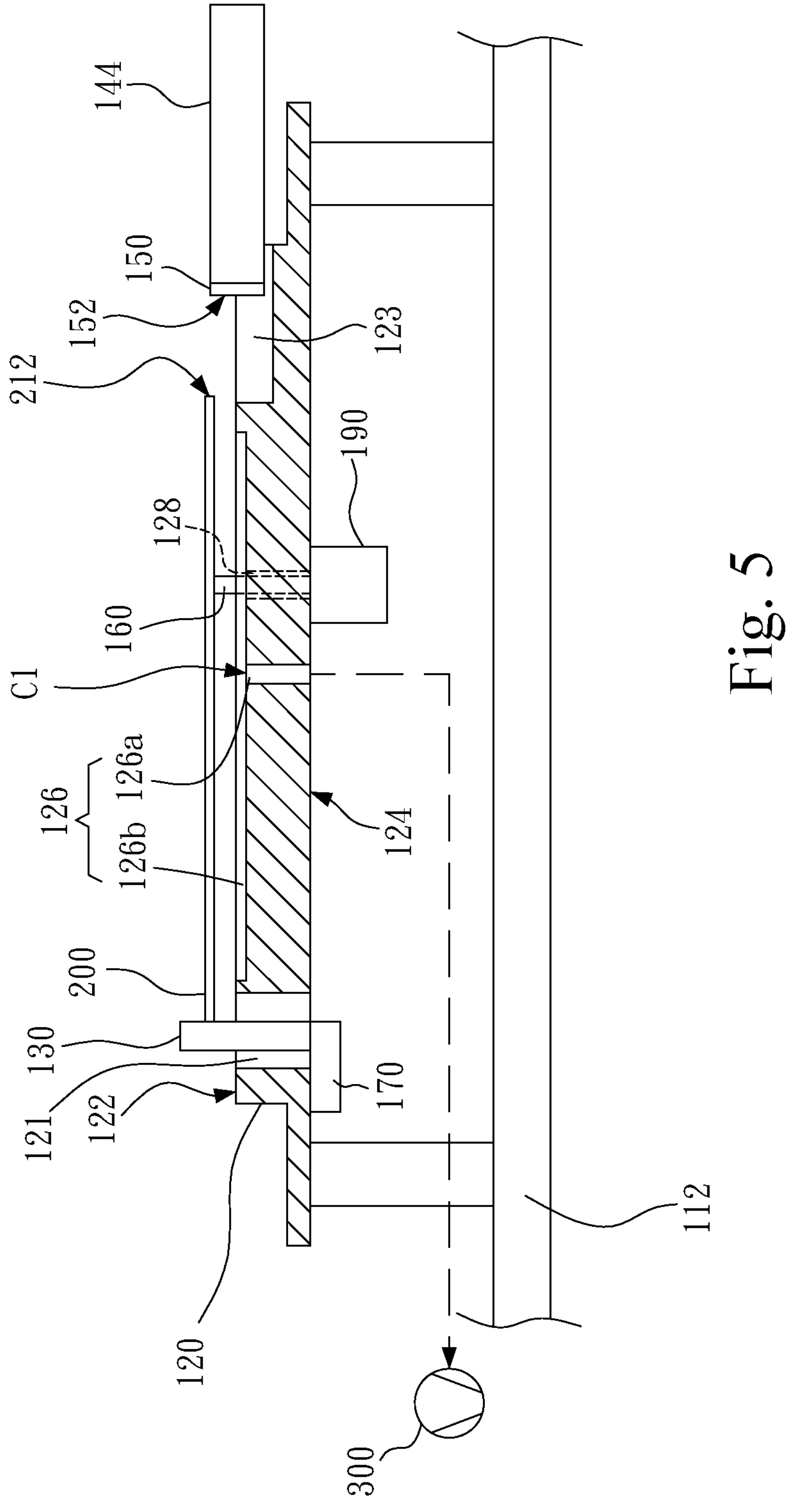
FIG. 5 is a partial cross-section view of the wafer holding device of the first embodiment.

As shown in FIG. 1, FIG. 2 and FIG. 5, the holder plate is disposed on the bottom 112 of the base 110. the holder plate 120 is disposed on the bottom 112 via supports, such that the holder plate 120 is spaced from the bottom 112, so as to dispose other components between the holder plate 120 and the bottom 112.

As shown in FIG. 1, FIG. 2 and FIG. 5, the holder plate 120 includes an upper surface 122 and a lower surface 124. The upper surface 122 is provided for the wafer 200 to be placed thereon. The upper surface 112 is provided with an adsorption structure 126. The adsorption structure 126 includes a vacuum adsorption orifice **126*a* connected to an air evacuating pump 300 and air-conducting grooves 126*b* connected to the vacuum adsorption orifice 126*a*, and adsorption structure 126 is configured to generate a negative pressure to adsorb the wafer 200. The vacuum adsorption orifice 126*a* communicates the upper surface 122 and the lower surface 124, and the vacuum adsorption orifice 126*a* connected to the air evacuating pump 300 at the lower surface 124**.

As shown in FIG. 1 and FIG. 5, the holder plate 120 is provided with a plurality of lifting holes 128, and the wafer holding device 100 further includes a plurality of lifting pins 160. The lifting pins 160 insert into the lifting holes 128 from the lower surface 124 of the holder plate 120. Driven by lifting units 190 such as hydraulic devices, pneumatic devices or linear motors, the lifting pins **160*e* disposed in the holder plate 120 in a rising and lowering manner. Therefore, the lifting pins 160 are able to lower and embedded in the holder plate 120 or rise to protrude on the upper surface 122. Moreover, the edges of the upper surface 122** may also be configured as a stepped structure.

As shown in FIG. 1, FIG. 2 and FIG. 5, the pushing pins 130 are disposed on the upper surface 120 in a protruding manner and are configured in accordance with the edge of the wafer 200. Each of the pushing pins 130 is disposed on the holder plate 120 at intervals around the holder plate with respect to a predetermined datum center C1 on the holder plate 120.

As shown in FIG. 1, FIG. 2 and FIG. 5, the pushing pins 130 are movably disposed on the holder plate 120, and protrude over the upper surface 122 of the holder plate 120. Taking the first embodiment as an illustration, the holder plate 120 is further provided with a plurality of slot-holes 121, the slot-holes 121 communicate the upper surface 122 and the lower surface 124, and an extension direction of each slot-hole 121 is extends to the predetermined datum center C1. Each pushing pin 130 is fixed on a fixing block 170. The fixing block 170 is movably disposed on the lower surface 124, and the corresponding pushing pin 130 passes through the slot-hole from the lower surface 124 and protrudes over the upper surface 122. Through displacement of the fixing block 170, the distance from a corresponding pushing pin 130 to the predetermined datum center C1 is changed, this allows multiple pushing pins 130 to fit wafers 200 of different diameters and sizes.

As shown in FIG. 1, FIG. 2, FIG. 3 and FIG. 4, the linear actuator 140 is directly and indirectly disposed on the base 110, and an actuating direction of the linear actuator 140 is in parallel to the upper surface 122. In particular, in the first embodiment the linear actuator 140 is connected to the lateral wall 114 via a bracket 180.

Figure 3:
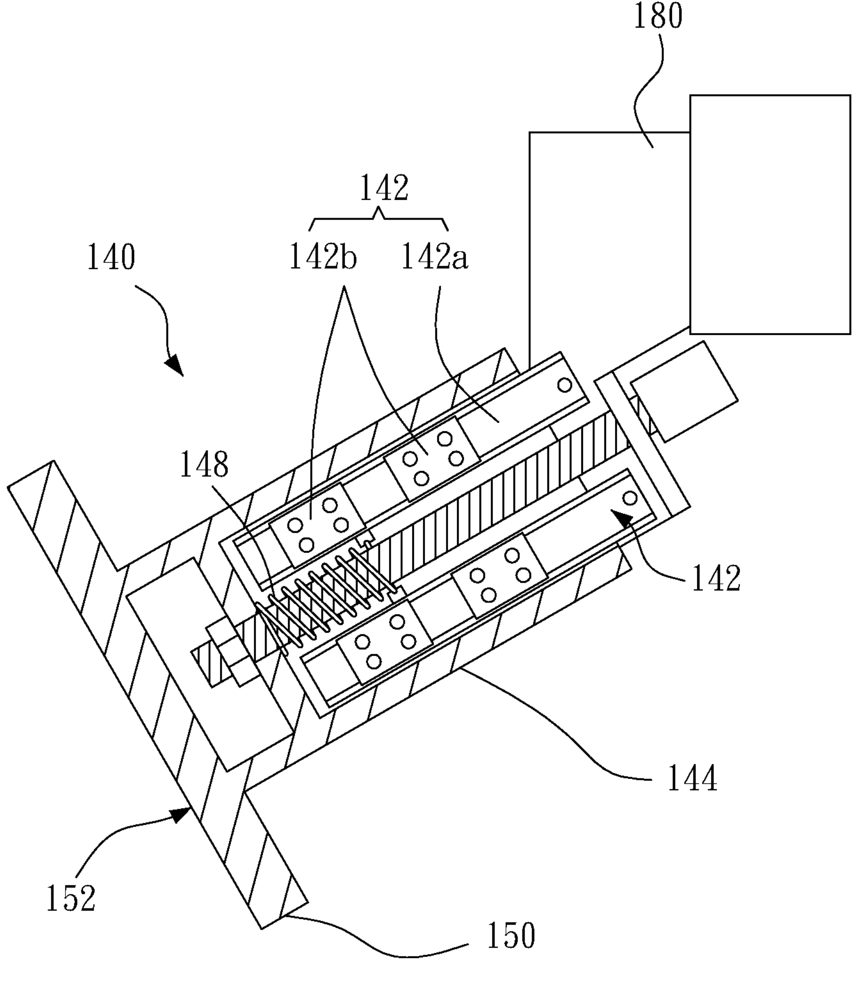
FIG. 3 is a top view of the linear actuator illustrating partial cross-section according to the first embodiment of this disclosure.
Figure 4:
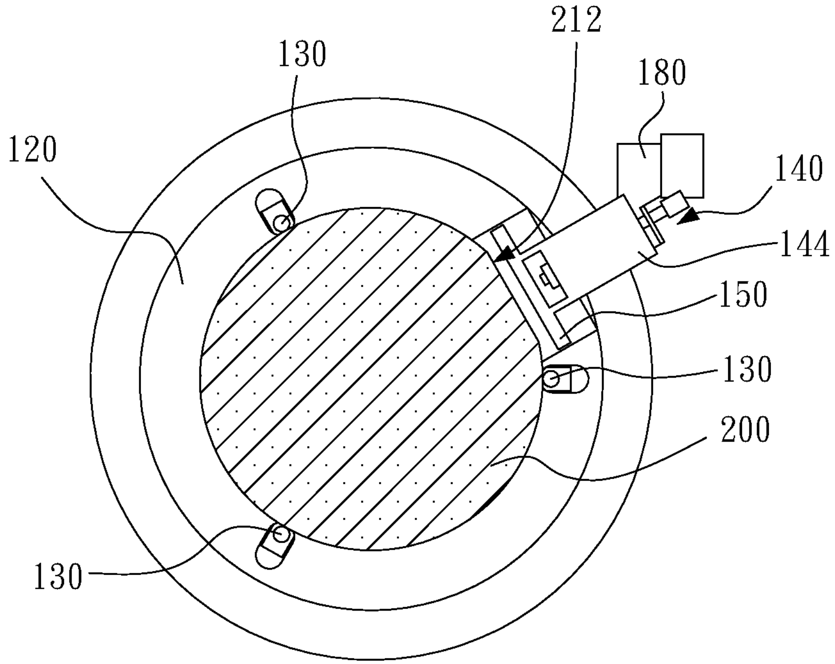
FIG. 4 is a top view of part of the components of the first embodiment.

As shown in FIG. 3, the linear actuator 140 is the first embodiment includes two linear guides 142, a movable block 144, a leadscrew 146 and the compression spring 148. The two linear guides 142 are configured in parallel and are connected to the bracket 180. Each of the linear guide 142 includes a slider **142*a* and a rail 142*b*. The slider 142*a* is combined with the rail 142*b* in a slidable manner. the movable block 144 is combined with the two linear guides 142 in a movable manner, and a moving direction of the movable block 144 is in parallel to the actuating direction of the linear actuator 140. In particular, in this embodiment, the movable block 144 is provided with a hollow space, and the linear guides 142 are partially located within the hollow space. The leadscrew 146 has one end connected to the bracket 180 in a rotatable manner, and the other end passing through the hollow space of the movable block 144 and connected to the movable block 144 in a rotatable manner. And the leadscrew 146 is located between two linear guides 142. The compression spring 148 is sleeved over the leadscrew 146. One end of the compression spring 148 presses against the movable block 144 and the other end connected to the two linear guides 142. Therefore, the elastic force of the compression spring 148 pushes the movable block 144 towards the holder plate 120 in a normal manner, in order to achieve a forward and backward cushion and to eliminate clearance in the linear guides 142 due to tolerances. The compression spring 148 allows for smoother movement of the movable block 144, and the movable block 144 does not experience frustration due to clearances when moving forward and backward. The positioning member 150 is connected to the linear actuator 140 to be driven by the linear actuator 140, so as to move in the actuating direction to contact and push against the positioning structure of the wafer 200. Specifically, the movable block 150 is fixed to the movable block 144, or the positioning member 150 is monolithically formed on the movable block 144. The positioning member 150 is provided with a position plane 152 at a front end. The position plane 152 is configured in accordance with the flat edge 212 of the wafer 200, and is perpendicular to the actuating direction of the linear actuator 140 and the upper surface 122**.

The configuration of the linear actuator 140 described above is an illustration and does not preclude other types of linear actuators 140, such as motors, combinations of gears and racks, or linear motors that are magnetically propelled.

Having the positioning member 150 slide over the upper surface 122 and contact the flat edges 212 of the wafer 200 is difficult to implement. The positioning member 150 contacts upper surface 122 and slides causing excessive frictional resistance; keeping the positioning member 150 spaced apart from the upper surface 122 would result in the positioning member 150 not being able to actually contact the flat edge 212, it is even the case that the positioning member 150 is unable to contact the flat edge 212 of the wafer 200 because the spacing distance is greater than the thickness of the wafer 200.

As shown in FIG. 1, FIG. 2, and FIG. 5, in one or more embodiments of this disclosure, the holder plate 120 is provides with a trough 123, and the trough 123 is located on the upper surface and communicates the edge of the holder plate 120. A part of the positioning member 150 and a part of the linear actuator 140 (the movable block 144) are movably disposed in the trough 123.

The following describes the flow of placing and positioning the wafer 200 in the first embodiment.

As shown in FIG. 5, first the lifting pins 160 rise to protrude over the upper surface 122 of the holder plate 120. the wafer 3 is moved by a robotic arm or other transportation equipment and placed on the lifting pins 224. In this step the flat edges 212 of the wafer 200 is placed to approximately correspond to the positioning member 150.

Figure 6:
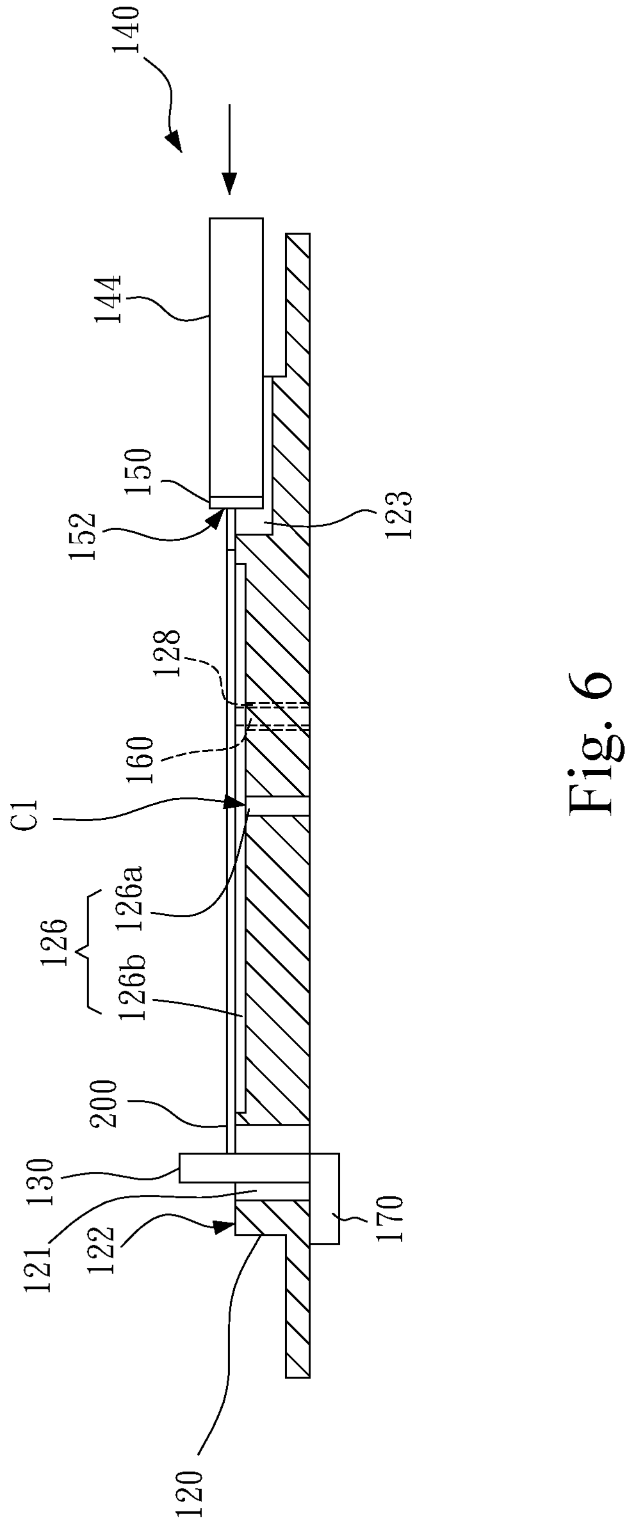
FIG. 6 is a cross-section view of part of the components of the first embodiment.
Figure 7:
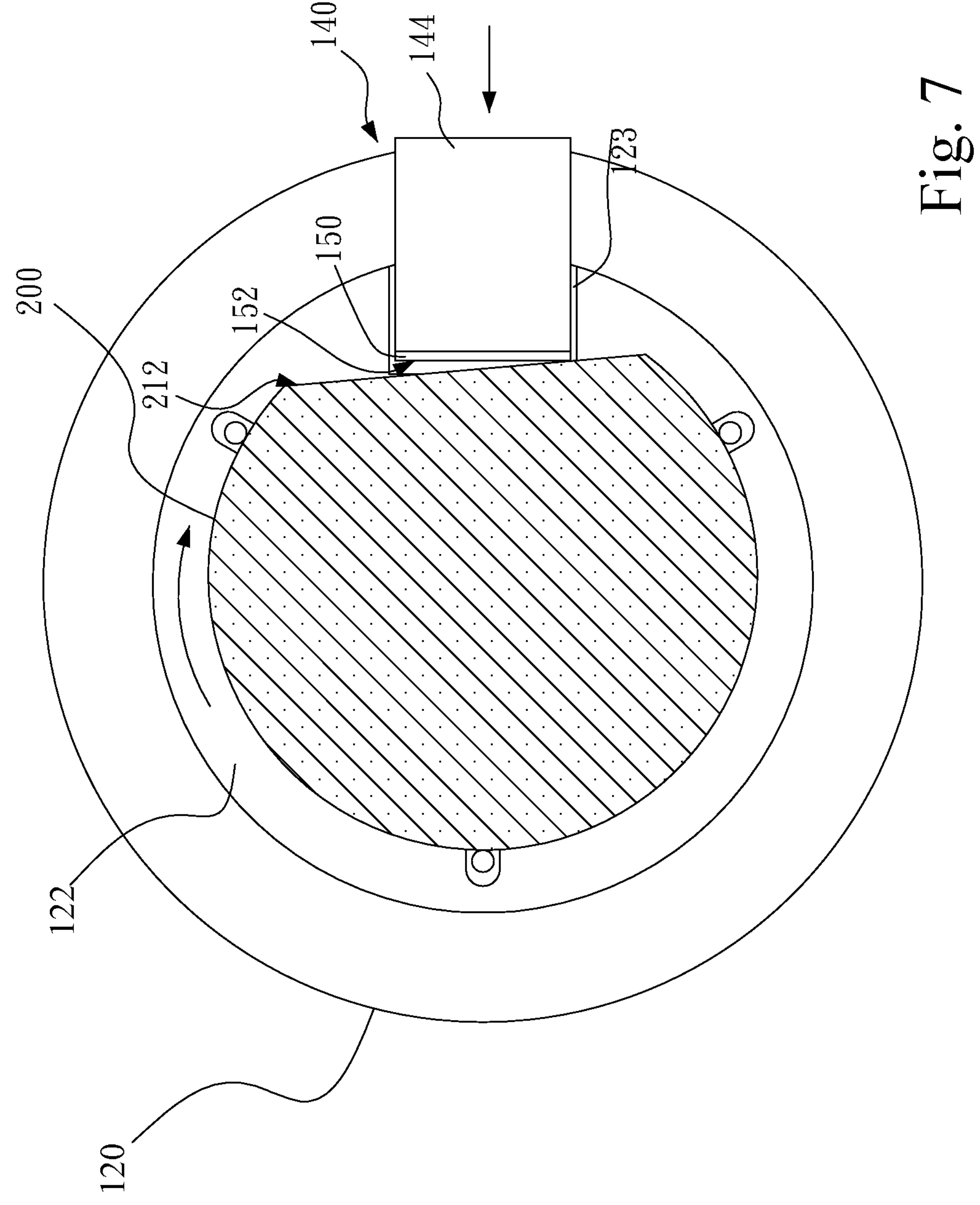
FIG. 7 is a top view of part of the components of the first embodiment.

As shown in FIG. 6 and FIG. 7, next, the lifting pins 160 lower and are fully embedded in the holder plate 120, to allow the wafer 200 to be placed on the upper surface 122. The linear actuator 140 starts to drive the positioning member 150, such that the position plane 152 of the positioning member 150 contacts and presses against the flat edge 212 of the wafer 200, so as to push the wafer 200 to move and rotate on the upper surface 122.

Figure 8:
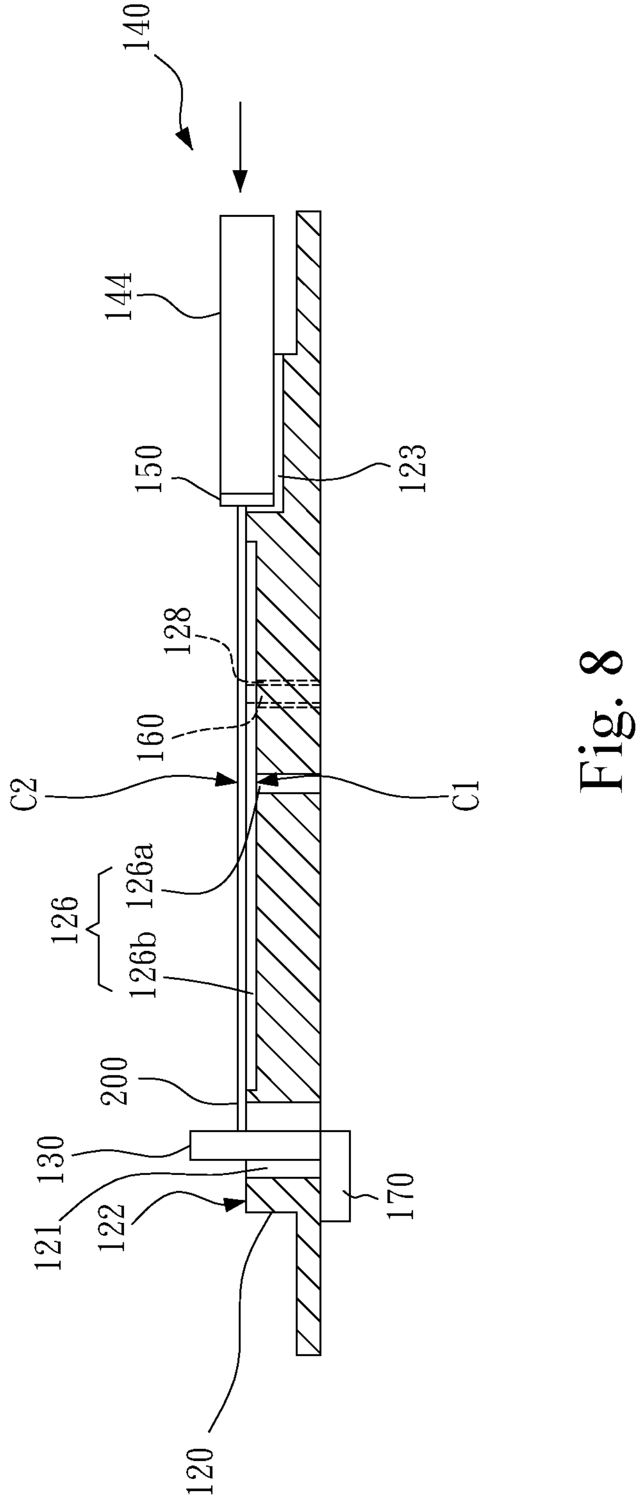
FIG. 8 is a cross-section view of part of the components of the first embodiment.
Figure 9:
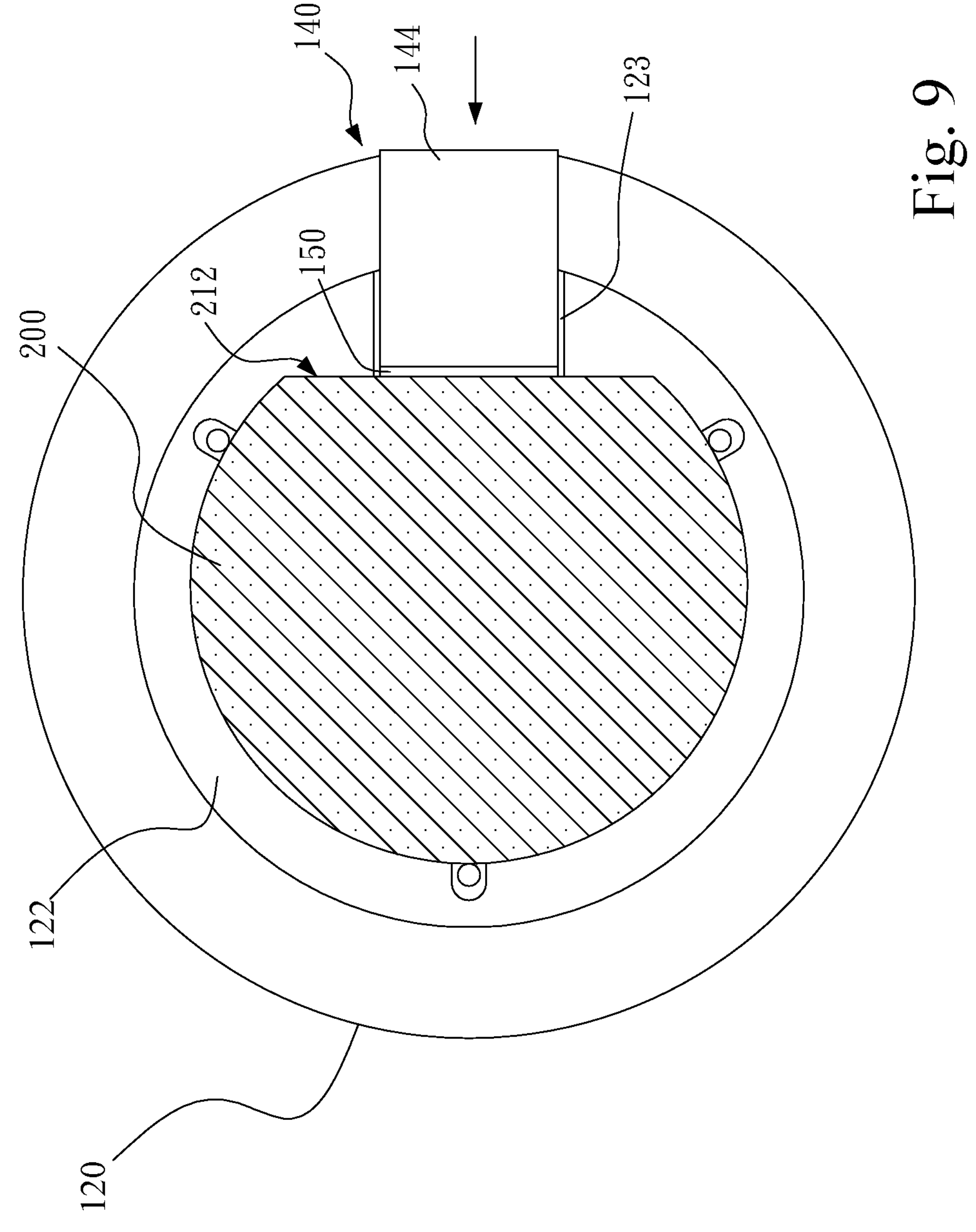
FIG. 9 is a top view of part of the components of the first embodiment.

As shown in FIG. 8 and FIG. 9, pushed by the positioning member 150, the wafer 200 moves one the upper surface 122 and the edge of the wafer contacts the pushing pons 130. Meanwhile the pushing pins 130 also move toward the predetermined datum center C1 to match the outer diameter of the wafer 200, so that the wafer center C2 is moved to coincide with the predetermined datum center C1. Then the wafer 200 pushed by the positioning member 150 starts to rotate, so that the positioning plane 152 of the positioning member 150 fits on the flat edge 212 of the wafer 200 to complete the positioning of the wafer 200.

Thereafter, the air evacuating pump 300 begins to operate, so that the adsorption structure 126 begins to provide negative pressure to adsorb/fix the wafer 200.

Figure 10:
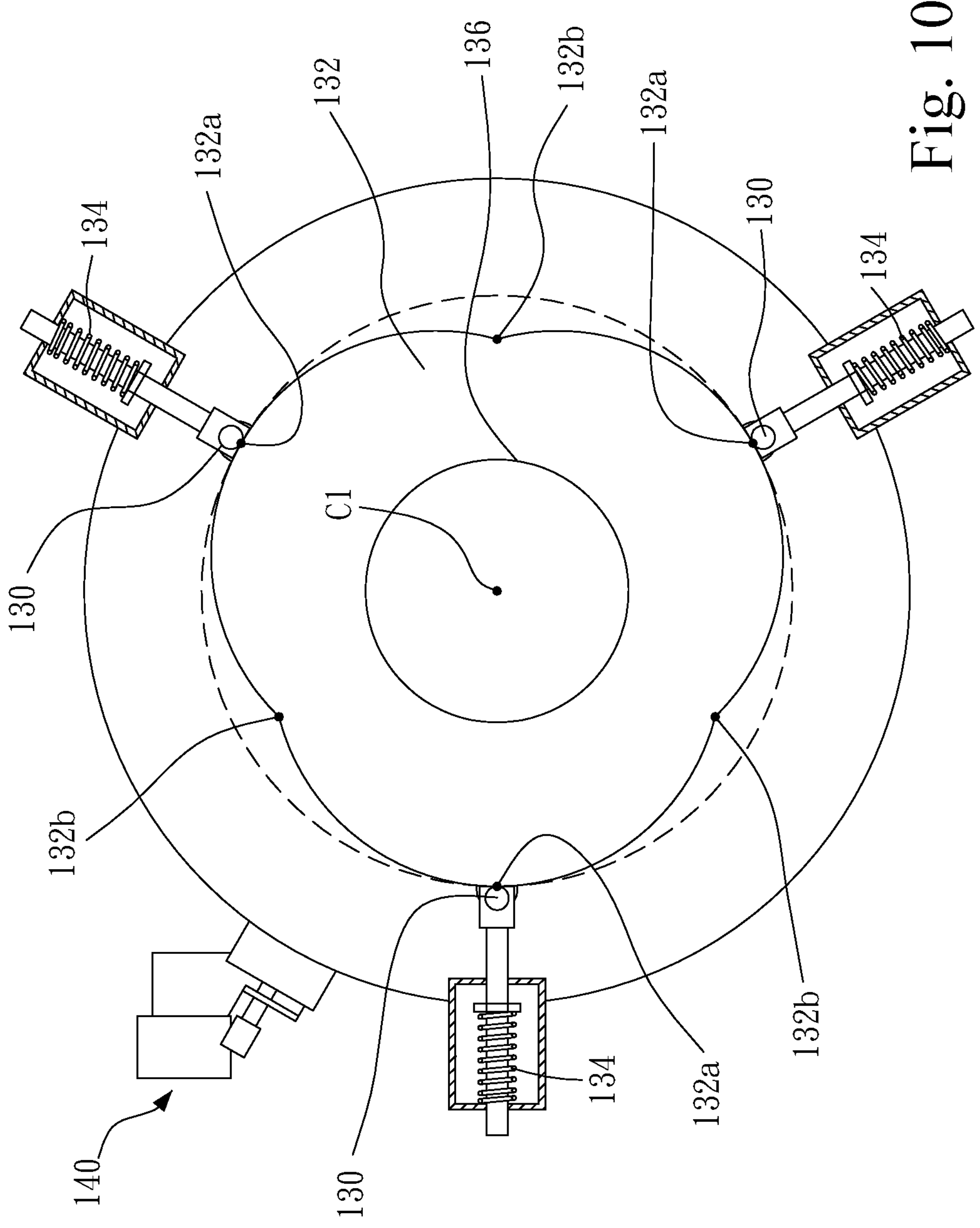
FIG. 10 and FIG. 11 are bottom views of the holder plate of the first embodiment, illustrating a driving mechanism for the pushing pins.
Figure 11:
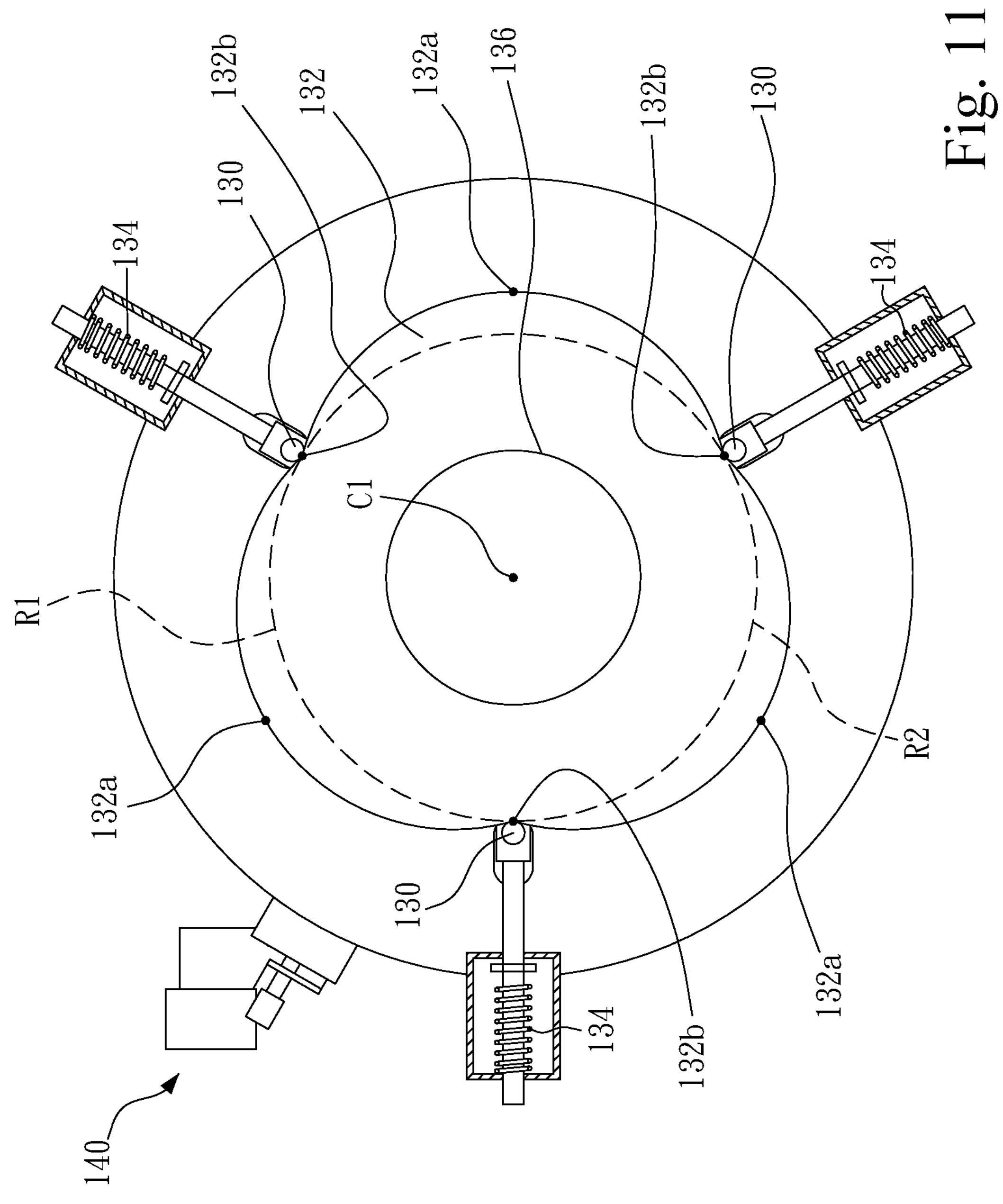

Please refer to FIGS. 10 and 11. A drive mechanism for the pushing pins 130 is illustrated and is adapted to one or more embodiment of this disclosure.

FIG. 10 and FIG. 11 are bottom views of the holder plate 120. As shown in the drawings, the drive mechanism of the pushing pins 130 comprises a flat cam 132, a plurality of elastic members 134, and a servo motor 136.

Figure 12:
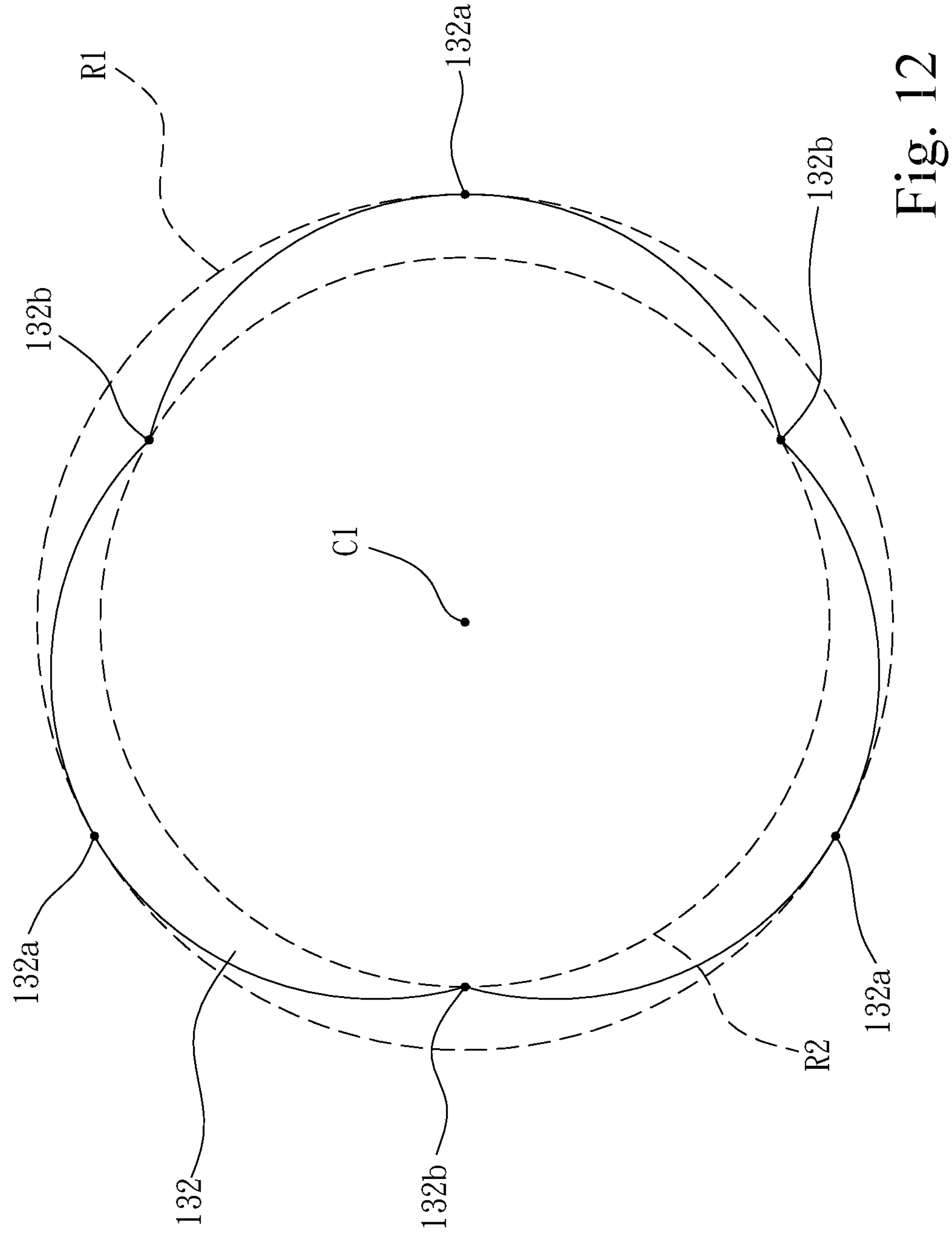
FIG. 12 is a schematic diagram of the maximum outer profile and the minimum outer profile of a planar cam in one or more embodiments of this disclosure.

As shown in FIG. 12, the planar cam 132 is rotatably disposed on the lower surface 124 of the holder plate 120, and the cam center coincides with the predetermined datum center C1. The planar cam 132 has a maximum outer profile R1 and a minimum outer profile R2. The diameter of the maximum outer profile R1 is larger than the diameter of the wafer 200, and the diameter of the minimum outer profile R2 is approximately equal to the diameter of the wafer 200. The planar cam 132 has a plurality of outer apexes 132*a*, corresponding to the pushing pins 130 and located at the maximum outer profile R1. The planar cam 132 also has a plurality of internal concave points 132*b* corresponding to the pushing pins 130 and located at the minimum outer profile R2.

As shown in FIG. 12, a plurality of elastic members 134 are disposed on the lower surface 124 of the holder plate 120. Each elastic member 134 respectively push the pushing pins 130 normally towards the predetermined datum center C1 such that the pushing pins 130 press against the planar cam 132.

As shown in FIG. 12, a servo motor 136 is connected to the planar cam 132 to drive the planar cam 132 to rotate relative to the holder plate 120.

Please refer to FIGS. 10 and 12. Using the three pushing pins 130 as an example, the planar cam 132 has three outer apexes 132*a* and three inner concave points 132*b* arranged in a staggered configuration. Before placing the wafer 200 on the upper surface 122 of the holder plate 120, the servo motor 136 rotates the planar cam 132 so that each of the three outer apexes 132*a* contacts and pushes one pushing pin 130. The pushing pin 130 is pushed to a position corresponding to the maximum outer profile R1 such that the wafer 200 can be placed on the upper surface 122 of the holder plate 120.

As shown in FIG. 11 and FIG. 12, then, the servo motor 136 drives the planar cam 132 to rotate at a predetermined angle. For example, in this embodiment the servo motor 136 drives the planar cam 132 to rotate 60 degrees, so that the three inner concave points 132*b* contact the pushing pins 130. At the time, the pushing pin 130 is also pushed by the elastic member 134 and moves towards the predetermined datum center C1 to continuously press against the outer profile of the planar cam 132 and contact the concave point 132*b*. At the time, the distance from the pushing pin 130 to the predetermined datum center C1 is approximately equal to the diameter of the wafer 200, and the wafer 200 can be positioned such that the wafer center C2 of the wafer 200 moves to coincide with the predetermined datum center C1.

By interfering with the movement of the planar cams 132, the plural pushing pins 130 can be synchronized to be displaced to ensure that the distance from the plural pushing pins 130 to the predetermined datum center remains consistent. Moreover, the positioning member 150 can be activated for positioning after the pushing pins 130 contact the concave points 132*b*, or the positioning member 150 can be activated at the same time as the pushing pins 130 to complete the positioning and alignment of the wafer 200 at the same time.

Figure 13:
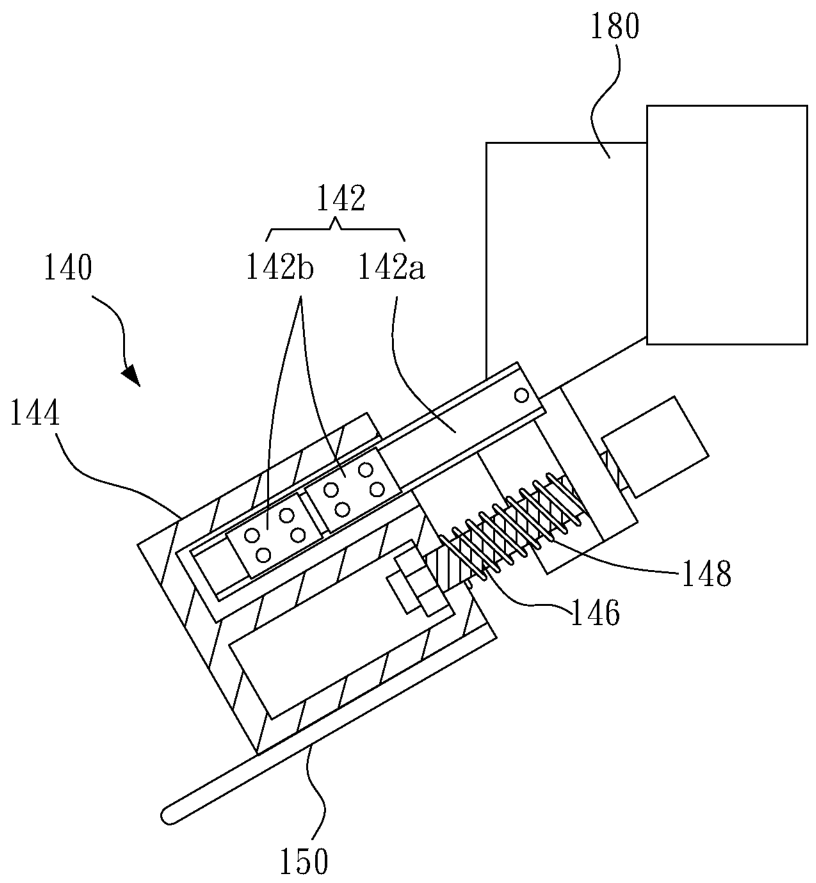
FIG. 13 is a top view of the linear actuator illustrating partial cross-section according to a second embodiment of this disclosure.

Please refer to FIG. 13, a linear actuator 140 and a positioning member 150 according to a second embodiment are illustrated and adapted to one or more embodiments of this disclosure. The positioning structure of the wafer 200 to which the second embodiment applies is a notch 214.

As shown in FIG. 13, the linear actuator 140 is directly and indirectly disposed on the base 110, and an actuating direction of the linear actuator 140 is in parallel to the upper surface 122. In particular, in the second embodiment the linear actuator 140 is connected to the lateral wall 114 via a bracket 180.

As shown in FIG. 13, the linear actuator 140 is the second embodiment includes a linear guide 142, a movable block 144, a leadscrew 146 and the compression spring 148. The two linear guides 142 are connected to the bracket 180. The linear actuator 140 in this embodiment may also be configured with two linear guides 142 in a left-right symmetrical configuration as in the first embodiment, the movable block 144 is combined with the linear guide 142 in a movable manner, and a moving direction of the movable block 144 is in parallel to the actuating direction of the linear actuator 140. and the linear guide 142 is partially located within the hollow space. The leadscrew 146 has one end connected to the bracket 180 in a rotatable manner, and the other end passing through the hollow space of the movable block 144 and connected to the movable block 144 in a rotatable manner. The compression spring 148 is sleeved over the leadscrew 146. One end of the compression spring 148 presses against the movable block 144 and the other end presses against the bracket 180. Therefore, the elastic force of the compression spring 148 pushes the movable block 144 towards the holder plate 120 in a normal manner, Different from the first embodiment, the compression spring 148 in the second embodiment is located outside the movable block 144, and compressed between the movable block 144 and the bracket 180.

Figure 14:
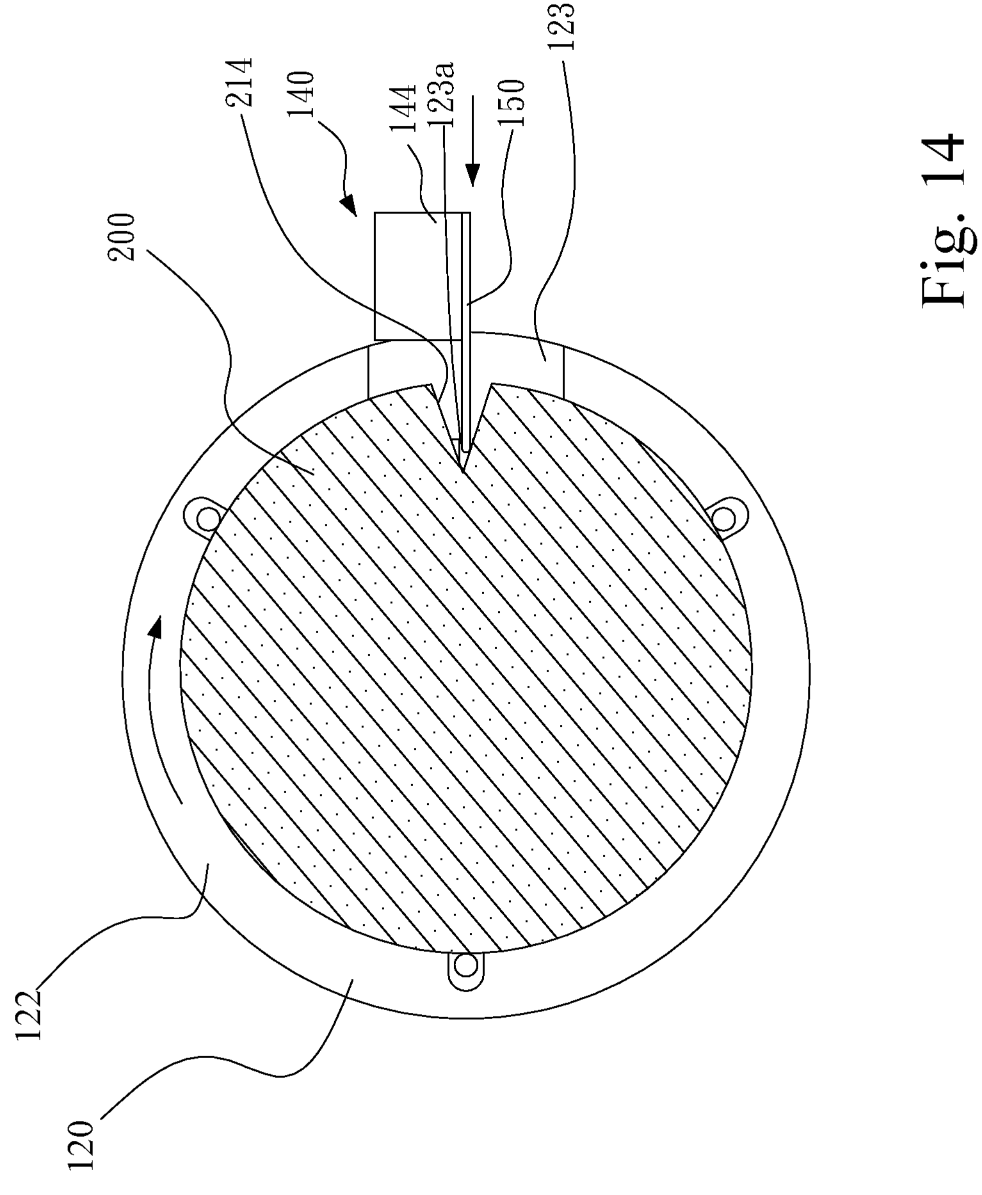
FIG. 14 is a cross-section view of part of the components of the second embodiment.
Figure 15:
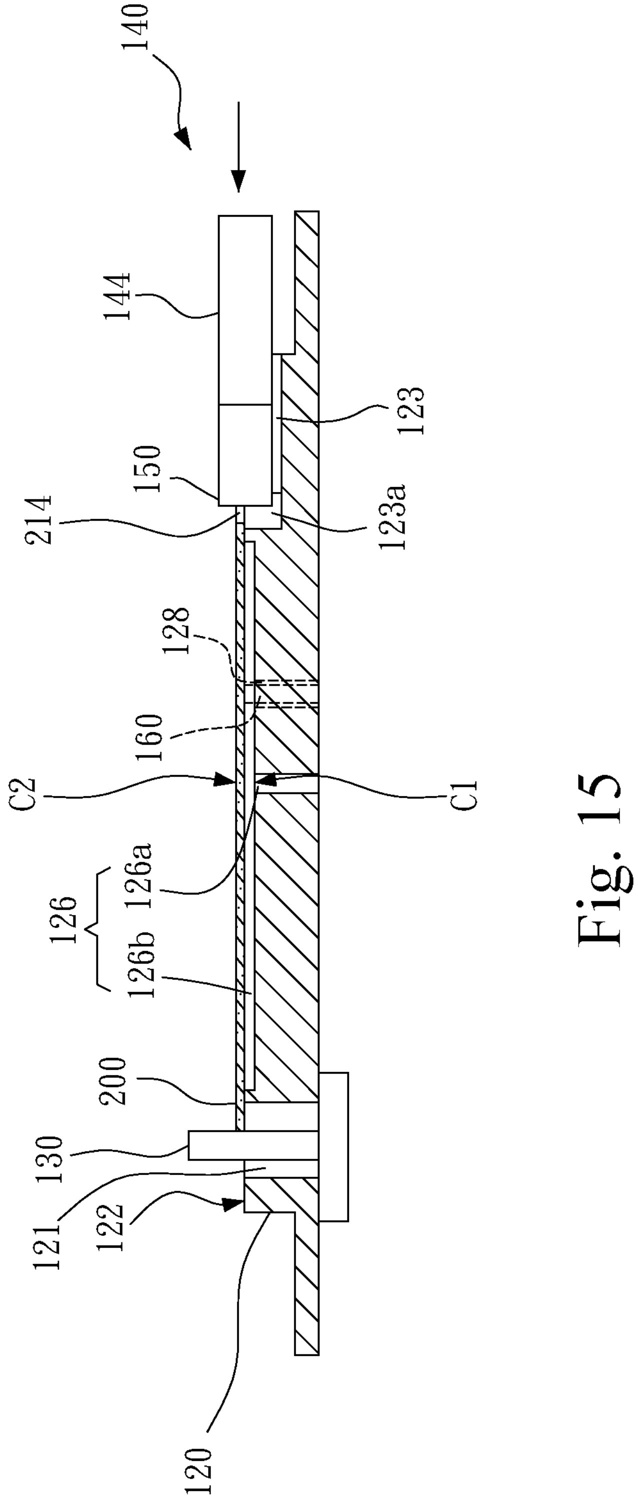
FIG. 15 is a top view of part of the components of the second embodiment.

As shown in FIG. 13, FIG. 14 and FIG. 15, the movable block 150 is fixed to the movable block 144, the positioning member 150 is flat, perpendicular to the upper surface 122, and extends toward the predetermined datum center C1. The front end of the positioning member 150 may be configured to have a guide angle. The front end of the positioning member 150 is used to insert a notch 214 that matches the wafer 200, to rest against the corner of notch 214.

Similarly, the holder plate 120 of the second embodiment is also provides with a trough 123, and the trough 123 is located on the upper surface and communicates the edge of the holder plate 120. Moreover, the groove 123 is further provided with an extension 123*a* extending toward the predetermined datum center C1. The extension 123*a* is used for insertion of the front end of the positioning member 150 to further approach the predetermined datum center C1.

The following describes the flow of placing and positioning the wafer 200 in the second embodiment.

As shown in FIG. 14 and FIG. 15, after the wafer 200 is placed on the upper surface 122, the linear actuator 140 starts to drive the positioning member 150, such that the front end of the positioning member 150 inserts into the notch 214 of the wafer 200, so as to push the wafer 200 to move and rotate on the upper surface 122.

Figure 16:
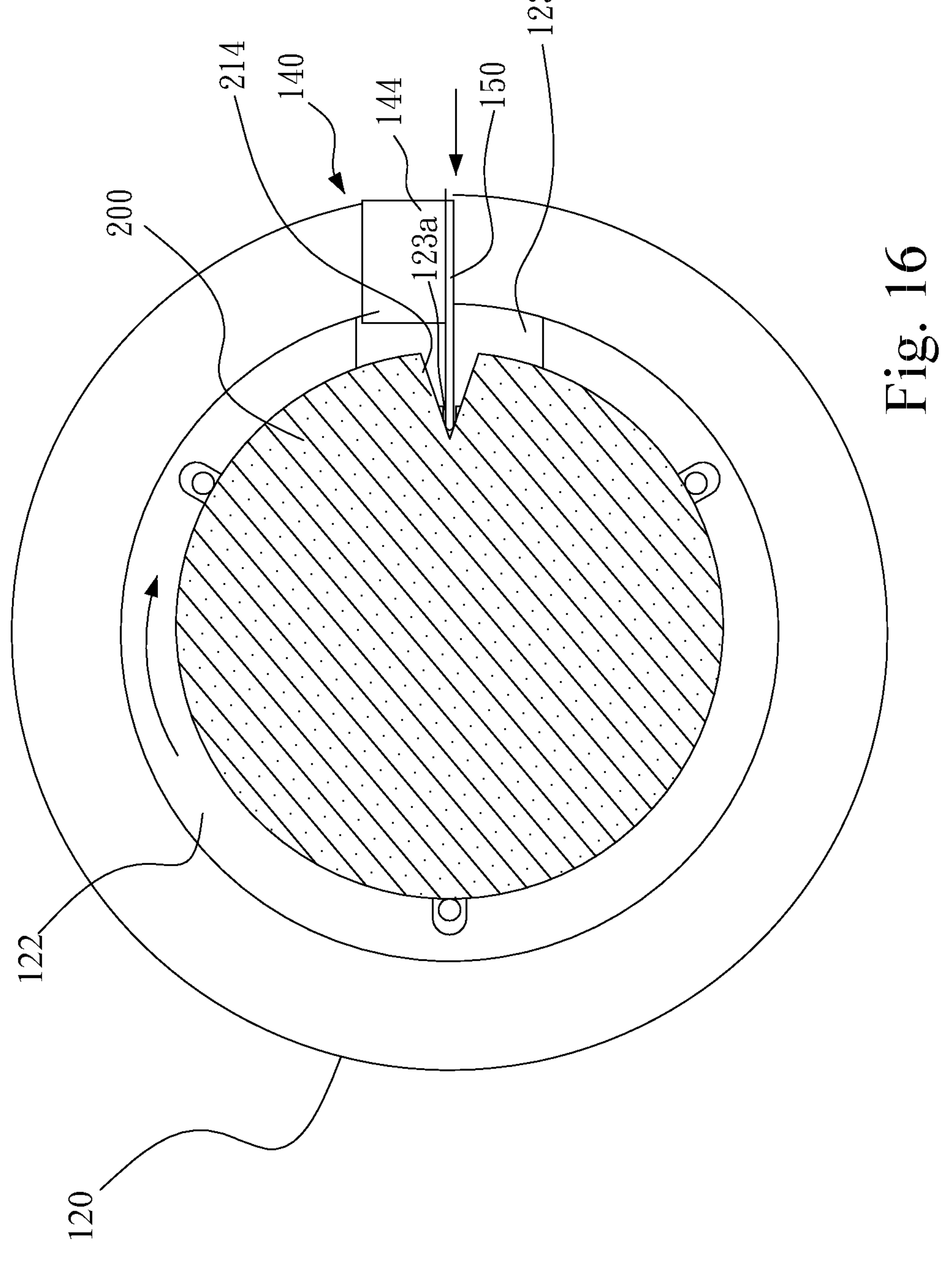
FIG. 16 is a cross-section view of part of the components of the second embodiment.
Figure 17:
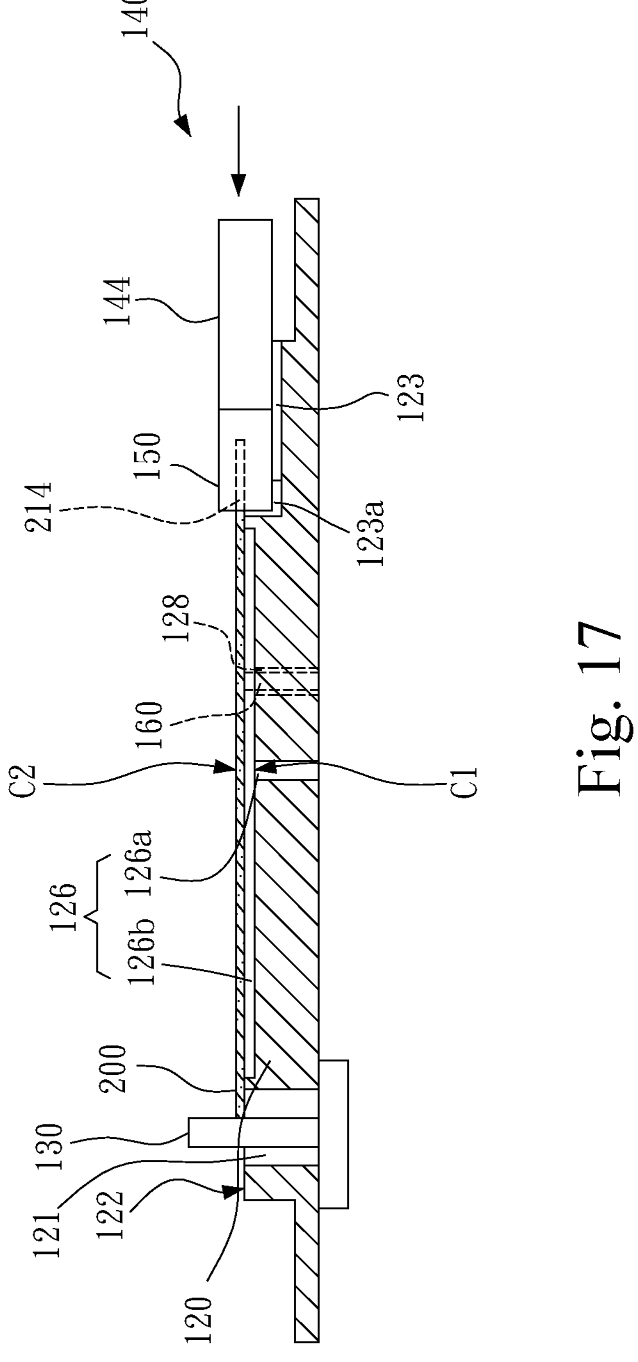
FIG. 17 is a top view of part of the components of the second embodiment.

As shown in FIG. 16 and FIG. 17, pushed by the positioning member 150, the wafer 200 moves one the upper surface 122 and the edge of the wafer contacts the pushing pons 130. so that the wafer center C2 is moved to coincide with the predetermined datum center C1. Then the wafer 200 rotates and the front end of the positioning member 150 rests against the corner of notch 214 to complete the positioning of the wafer 200. Thereafter, the air evacuating pump 300 begins to operate, so that the adsorption structure 126 begins to provide negative pressure to adsorb/fix the wafer 200.

The wafer holding device 100 achieves wafer positioning through the coordination of the positioning structure, the positioning member 150, and a pushing pins 130. The positioning process does not involve the detection and identification of wafer 200 position/positioning structure, greatly simplifying the complexity of the positioning mechanism. In addition, this disclosure achieves quick positioning and easily improves the accuracy of positioning without affecting the rate at which the positioning operation is performed.

What is claimed is:

1. A wafer holding device having function of positioning a wafer, configured to fix the wafer thereon and position the wafer, wherein the wafer is provided with a positioning structure; comprising:

a base;

a holder plate, disposed on the base; wherein the holder plate includes an upper surface and a lower surface; the upper surface is provided for the wafer to be placed thereon; and the upper surface is provided with an adsorption structure for adsorbing and fixing the wafer;

a plurality of pushing pins, disposed on the upper surface in a protruding manner; wherein each of the pushing pins is disposed on the holder plate at intervals around the holder plate with respect to a predetermined datum center on the holder plate;

a linear actuator, disposed on the base; wherein an actuating direction of the linear actuator is in parallel to the upper surface; and a positioning member, configured to be driven by the linear actuator to move in the actuating direction to contact and push against the positioning structure of the wafer.

2. The wafer holding device according to claim 1, wherein the adsorption structure includes a vacuum adsorption orifice and air-conducting grooves connected to the vacuum adsorption orifice, and the vacuum adsorption orifice communicates the upper surface and the lower surface.

3. The wafer holding device according to claim 2, further comprising an air evacuating pump; wherein the vacuum adsorption orifice is connected to the air evacuating pump at the lower surface.

4. The wafer holding device according to claim 1, wherein a plurality of lifting pins, disposed in the holder plate in a rising and lowering manner; wherein the lifting pins are able to lower and embedded in the holder plate or rise to protrude on the upper surface.

5. The wafer holding device according to claim 1, wherein the linear actuator is connected to the base via a bracket, and the linear actuator includes:

at least one linear guide;

a movable block, combined with the at least one linear guide in a movable manner, and a moving direction of the movable block is in parallel to the actuating direction of the linear actuator; and a leadscrew, having one end connected to the bracket in a rotatable manner and the other end passing through a hollow space of the movable block and connected to the movable block in a rotatable manner.

6. The wafer holding device according to claim 5, wherein the linear actuator further includes a compression spring sleeved over the leadscrew; wherein one end of the compression spring presses against the movable block and the other end connected to the at least one linear guide.

7. The wafer holding device according to claim 5, wherein the linear actuator further includes a compression spring sleeved over the leadscrew; wherein one end of the compression spring presses against the movable block and the other end presses against the bracket.

8. The wafer holding device according to claim 1, wherein the positioning member is provided with a position plane at a front end.

9. The wafer holding device according to claim 1, wherein the positioning member is flat, perpendicular to the upper surface, and extends toward the predetermined datum center.

10. The wafer holding device according to claim 1, wherein the holder plate is provided with a trough and the trough is located on the upper surface and communicates an edge of the holder plate; wherein a part of the positioning member and part of the linear actuator are movably disposed in the trough.

* * * * *